United States Patent [19]
Kowalczyk et al.

[11] Patent Number: 5,870,574
[45] Date of Patent: Feb. 9, 1999

[54] SYSTEM AND METHOD FOR FETCHING MULTIPLE GROUPS OF INSTRUCTIONS FROM AN INSTRUCTION CACHE IN A RISC PROCESSOR SYSTEM FOR EXECUTION DURING SEPARATE CYCLES

[75] Inventors: Andre Kowalczyk, San Jose; Givargis G. Kaldani, Los Gatos, both of Calif.

[73] Assignee: Silicon Graphics, Inc., Mountain View, Calif.

[21] Appl. No.: 686,363

[22] Filed: Jul. 24, 1996

Related U.S. Application Data

[62] Division of Ser. No. 491,491, Jun. 16, 1995, Pat. No. 5,568,442, which is a continuation of Ser. No. 46,189, Apr. 12, 1993, abandoned.

[51] Int. Cl.[6] .............................. G06F 9/30; G06F 12/00
[52] U.S. Cl. ............................... 395/382; 711/125; 711/3
[58] Field of Search ............................... 711/125, 137, 711/5, 3; 395/382, 383

[56] References Cited

U.S. PATENT DOCUMENTS

| | | | |
|---|---|---|---|
| 3,949,376 | 4/1976 | Ball et al. | 364/239 |
| 4,695,981 | 9/1987 | Sikich et al. | 365/227 |
| 4,783,767 | 11/1988 | Hamada | 365/189 |
| 4,817,057 | 3/1989 | Kondo et al. | 365/230.03 |
| 4,918,662 | 4/1990 | Kondo | 365/230.03 |
| 4,926,354 | 5/1990 | Roy | 365/230.03 |
| 4,931,994 | 6/1990 | Matsui et al. | 365/189.01 |
| 5,150,330 | 9/1992 | Hag | 365/230.03 |
| 5,170,375 | 12/1992 | Mattausch et al. | 365/230.03 |
| 5,263,002 | 11/1993 | Suzuki et al. | 365/230.03 |
| 5,285,323 | 2/1994 | Hetherington et al. | 711/122 |
| 5,293,332 | 3/1994 | Shirai | 365/189.02 |
| 5,293,343 | 3/1994 | Raab et al. | 365/205 |
| 5,329,492 | 7/1994 | Mochizuki | 365/230.01 |
| 5,335,330 | 8/1994 | Inoue | 395/588 |
| 5,367,655 | 11/1994 | Grossman et al. | 365/230.03 |
| 5,388,072 | 2/1995 | Matick et al. | 365/230.03 |

*Primary Examiner*—Jack A. Lane
*Attorney, Agent, or Firm*—Sterne, Kessler, Goldstein & Fox P.L.L.C.

[57] ABSTRACT

A system and method for fetching instructions for use in a RISC processor having an on-chip instruction cache is disclosed. The system accesses a first group of instructions having a first set of ordered addresses and a second group of instructions having a second set of ordered addresses, simultaneously, from an instruction cache. The first group of instructions is to be executed during a first cycle and the second group of instructions is to be executed during a second cycle. The technique transfers the first group of instructions to an instruction decoder for execution during the first cycle and transfers the second group of instructions to the instruction decoder for execution during the second cycle. The technique reduces the power consumed by memory modules and support circuitry of the instruction cache by requiring instruction cache accesses only every other cycle.

14 Claims, 5 Drawing Sheets

SYSTEM AND METHOD FOR FETCHING MULTIPLE GROUPS OF INSTRUCTIONS FROM AN INSTRUCTION CACHE IN A RISC PROCESSOR SYSTEM FOR EXECUTION DURING SEPARATE CYCLES

This application is a division of application Ser. No. 08/491,491, filed Jun. 16, 1995 now U.S. Pat. No. 5,568,442, which is a continuation of Ser. No. 08/046,189 filed Apr. 12, 1993, now abandoned.

BACKGROUND OF THE INVENTION

This invention relates generally to a computer with a reduced instruction set, and more particularly to such computer having an improved instruction fetch system and a segmented cache memory with predecoded addressing.

From the standpoint of instruction sets in a processor, computer architects have developed two general approaches: complex instruction set computer (CISC) processors provide an extensive set of optimized instructions to address all sorts of special-purpose needs, while reduced instruction set computer (RISC) processors provide, in general, a smaller set of more simplified and uniform instructions from which more complex instructions can be constructed. The wide range and complexity of the instructions provided by CISC processors contribute to the complexity of the hardware and reduce the efficiency of a chip as a whole. Techniques such as microcoding and trap and emulate have made the increasing complexity of the CISC processor hardware design more manageable. However, for high end CISC processors, where optimization of speed and performance is the goal, implementation of the hardware remains highly complex and very expensive.

The contrasting RISC approach aims to simplify all of the architectural aspects of the design of a machine so that its implementation can be made more efficient. RISC designs take advantage of the fact that some of the more elaborate CISC instructions are either not used at all by most compilers, or if they are, they are used very rarely. There is, therefore, an emphasis on a smaller number of uniform instruction formats, preferably all of the same size. The regularity of these formats simplifies the instruction-decoding mechanism and allows for the use of pipelining in which several instructions are being executed at once.

Simple and uniform instruction formats, pipelining of several instructions, simplified memory addressing and register-to-register operations are some of the typical features of a RISC processor design. The combination of these techniques has made possible high performance RISC processors with very efficient architectures and maximum throughput (i.e. execution rates of one instruction per clock cycle). Further refinements made to these techniques has produced a family of successful RISC processors based on the MIPS architecture (R2000, R3000, R4000 and R6000) developed by MIPS Technology, Inc., a wholly-owned subsidiary of Silicon Graphics, Inc. of Mountain View, Calif.

RISC processor designs continue to push the state of the art to further increase efficiency and throughput to achieve execution rates of even greater than one instruction per clock cycle. However, while this trend has resulted in very high performance RISC processor chips, the power dissipation and cost have increased in parallel. As a result, portable computing devices such as desktop and notebook computers have not benefited from the high performance levels provided by RISC processors.

From the above it can be appreciated that there is a need for a low-power, low-cost RISC processor that provides the high performance advantages of RISC designs with reduced cost and power dissipation for portable computing devices.

SUMMARY OF THE INVENTION

The present invention offers a processor based on the MIPS RISC architecture that meets the requirements of low-cost applications without compromising performance.

According to one aspect of the invention, the cache in a RISC processor is segmented to reduce word line lengths. The reduced lengths reduce capacitive loading of the word lines thereby reducing power consumption and increasing speed.

According to a further aspect of the invention, a portion of the cache address is predecoded on the processor to select a particular segment of the cache memory.

According to a still further aspect of the invention, multiple instructions are transferred in parallel from the I-Cache to a staging register. During sequential execution the instructions are read from the staging register thereby reducing cache accesses and power consumption.

Further aspects of the invention will become apparent in view of the following detailed description and appended drawings.

DESCRIPTION OF THE PREFERRED EMBODIMENT

Figure 1:
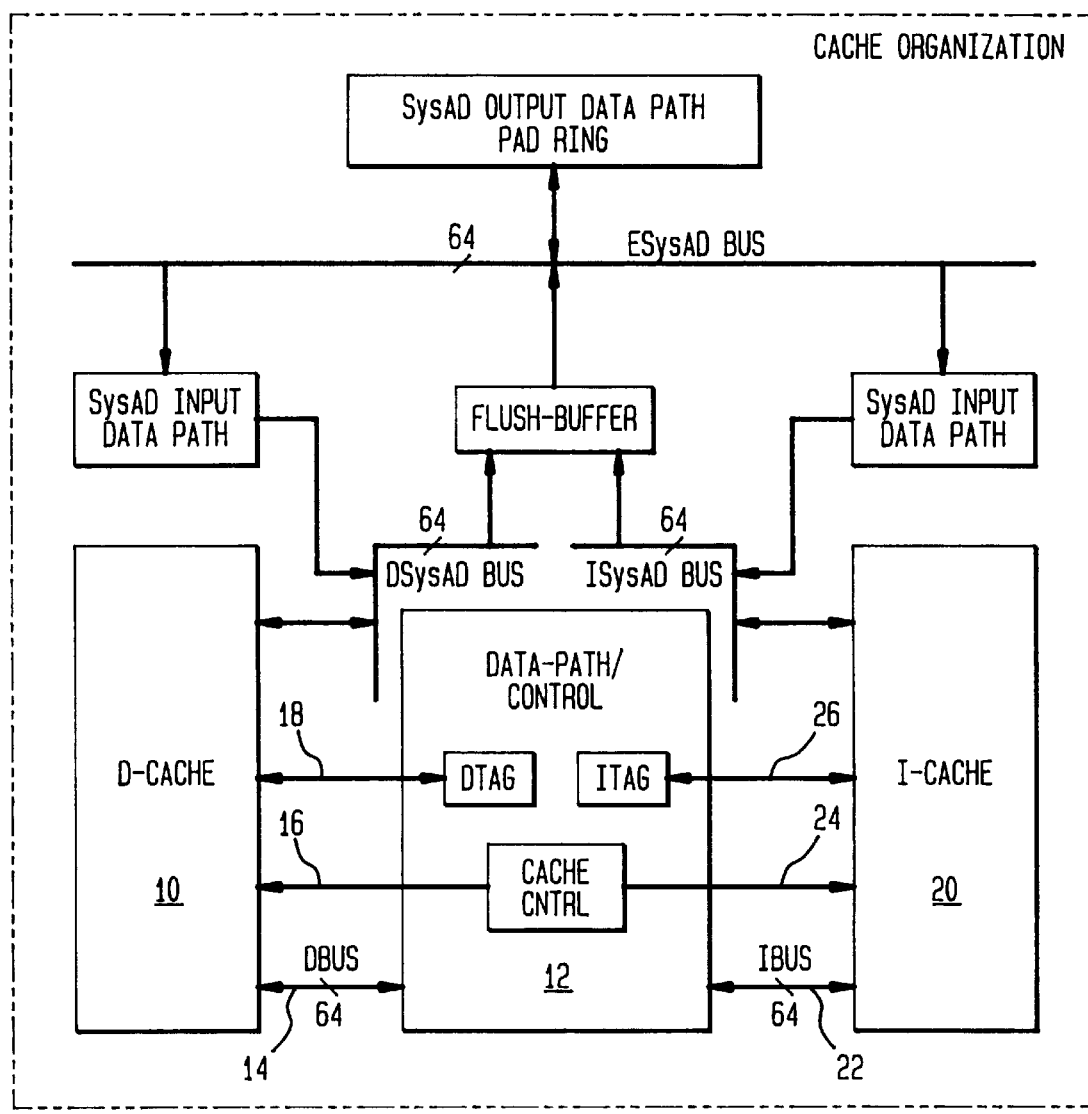
FIG. 1 is a block diagram of the cache organization of a RISC microprocessor.

RISC microprocessors utilize cached instruction and operand data to increase the execution speed and simplify the instruction set. FIG. 1 is a high level block diagram of the cache structure of a RISC microprocessor. In FIG. 1, a Data cache 10 (D-Cache) and a Data-Path/Control block 12 are coupled by a 64-bit DBus 14, a control bus 16, and a DTAG bus 18 and an Instruction cache 20 (I-Cache) and the Data-Path/Control block 12 are coupled by a 64-bit IBus 22, a control bus 24, and an ITAG bus 26. Additionally, buses and data paths are provided to couple both caches to external memory.

Figure 2:
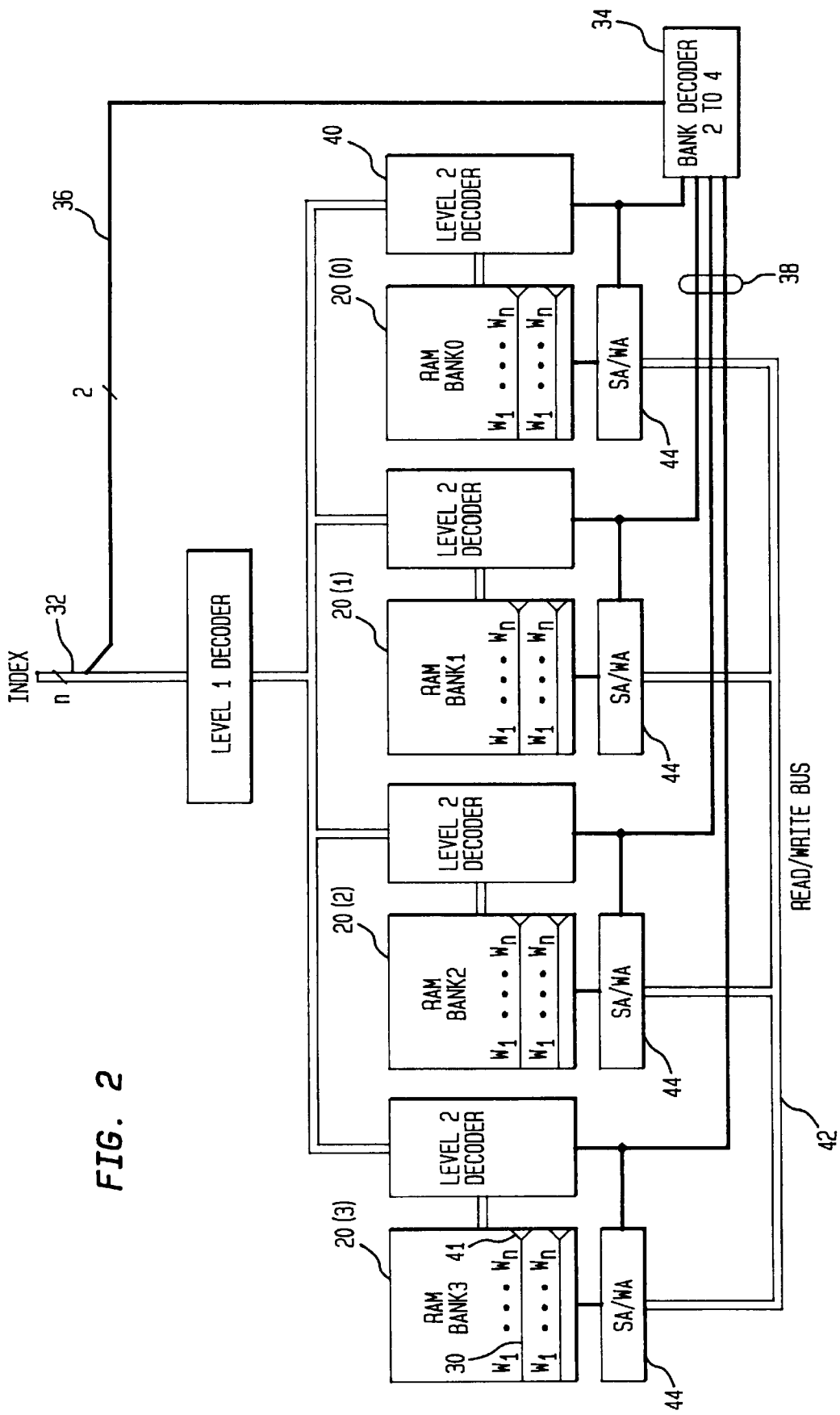
FIG. 2 is a block diagram of a segmented cache.

FIG. 2 is a block diagram of the I-cache conceptually illustrating the memory segmentation and address bit predecoding. The data storage part of the I-Cache 20 is organized into 256 eight-word lines, where each word is 32 bytes.

The data storage part of the cache is divided into four segments 20(0)–20(3) which are selectively activated by segment select signals. Each segment is organized into 256 two-word lines 30. A 10-bit INDX signal is provided on an INDXBUS 32. Two bits of the index (address) signal are routed to a 2:4 PREDECODER 34 on a PREDECBUS 36 to generate the segment select signals on select control lines 38. The remaining 8 bits of index signal are routed to 8:256 XDECs 40 located in each segment. Each word segmented word line 30 is coupled to XDEC 40 by a word line driver 41. An I/O port of each segment 20 is coupled to a READ/

WRITE BUS 42 by a sense amp/write amp block 44. The select control lines 38 are coupled to respective ones of the XDECs 40 and sense amp/write amp blocks 44.

Figure 3:
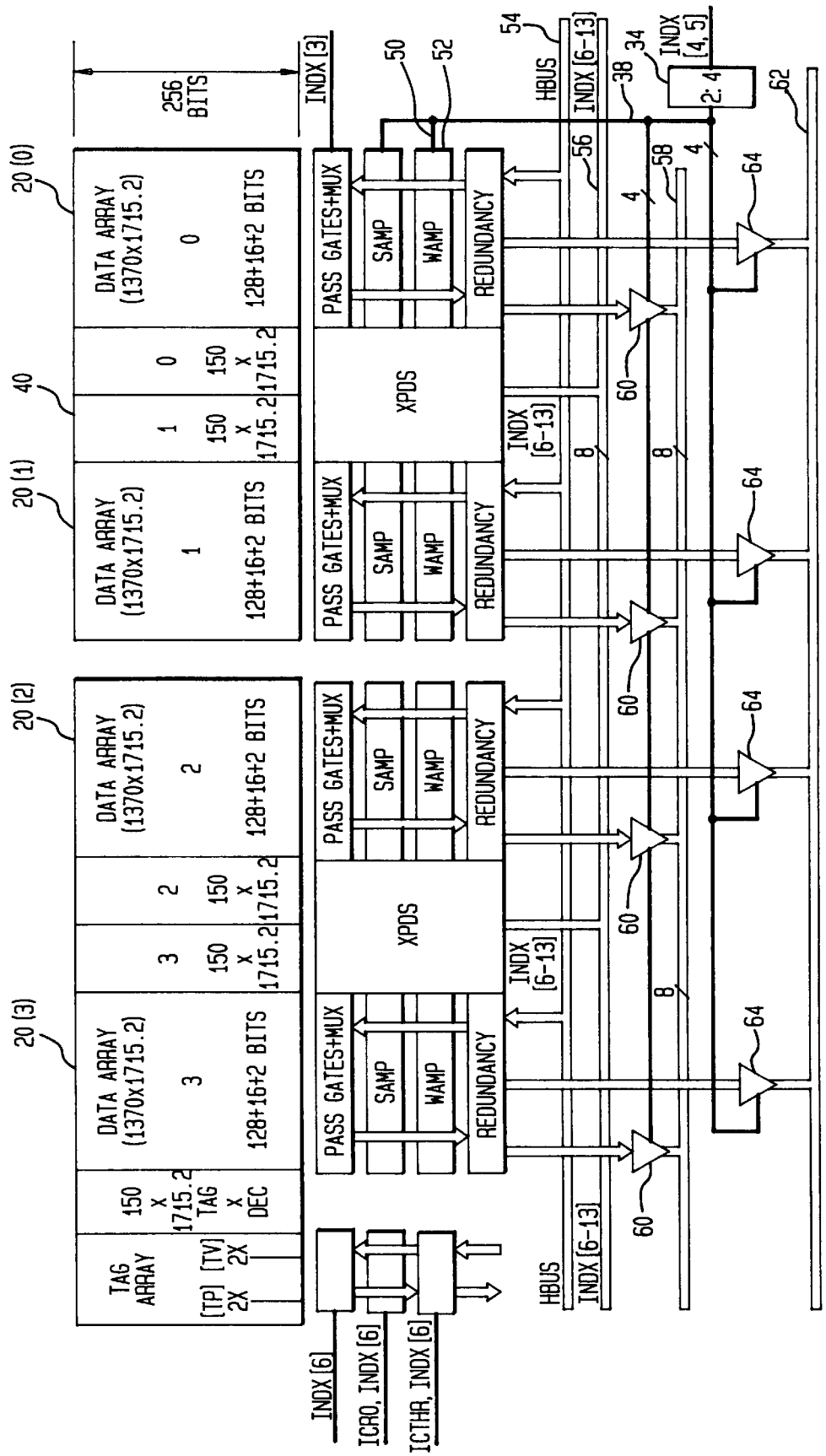
FIG. 3 is a detailed block diagram of a segmented instruction cache.

FIG. 3 is a schematic diagram of the I-Cache. Each segment included sense amps 50 and write drivers 52. The segments are coupled to a HBUS 54, INDX[6..13] BUS 56, PARITY BUS 58 via PDRIVERS 60, and IBUS 62 via IDRIVERS 64. The INDX[4,5] bits are coupled to the 2:4 PREDECODER 34 which selectively activates 1 of 4 pairs of drivers 60 and 64 to couple the output of a selected segment to the PARITY BUS 58 and IBUS 62. The INDX [6..13] BUS 56 couples 8 address bits to an XPDS 62 to select one of the 256 word lines in the selected segment.

Figure 4:
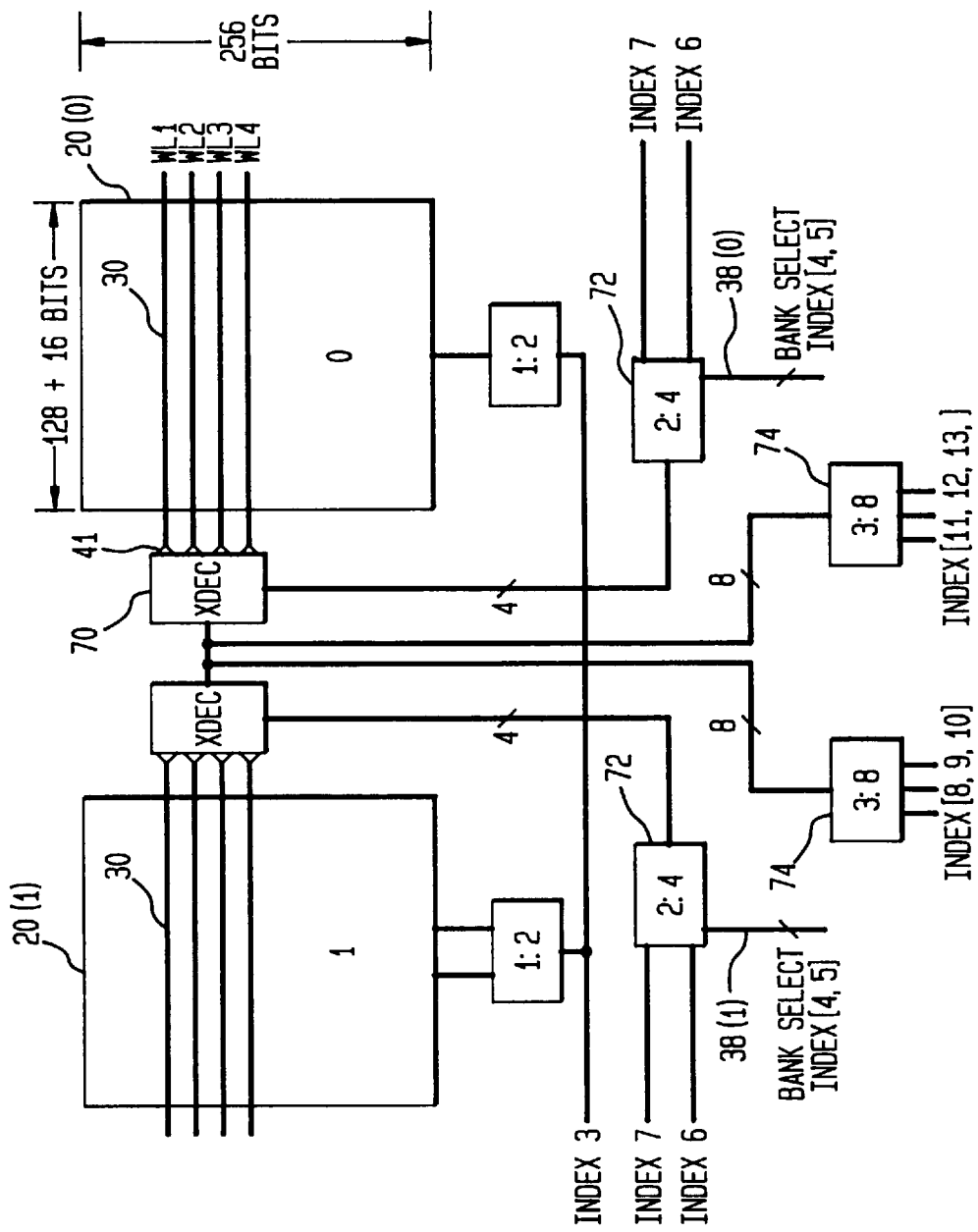
FIG. 4 is a block diagram of a hierarchical word line decoding system.

FIG. 4 is a schematic diagram of the hierarchical word line decoding of a pair of segments. Each segment includes 64 xdecs 70, each for selecting one of four word lines. The INDX6 and INDX7 bits are decoded by a 2:4 word line select decoder 72 to select the word line. INDX[8,9,10] and INDX[11,12,13] are decoded by two 3:8 xdec select decoders 74 to select one of the 64 xdecs.

The segmented cache system depicted in FIGS. 2–4 utilizes word line segments of two words and bit line lengths of 256 bits to provide for cache storage of 16 kilobytes. Without segmentation either the word lines or bit lines would be increased in length thereby increasing capacitive loading to increase power consumption and decrease speed.

The hierarchical word line decoding allows predecoding of the segment select bits to enable the word line select decoder. Additionally, the INDX[4,5] bits enable only the sense amps, write amps, and word line drivers of the activated segment. Each of these amps and drivers consumes power when activated so that the selective activation reduces the overall power consumption of the processor.

Further reduction of power is achieved by reducing the number of I-Cache accesses. The RISC processor is designed to execute an instruction every cycle thereby requiring a greater number of I-Cache accesses than conventional CISC processors. Each cache access consumes power so that the reduction of cache accesses lowers the power consumption of the chip.

Figure 5:
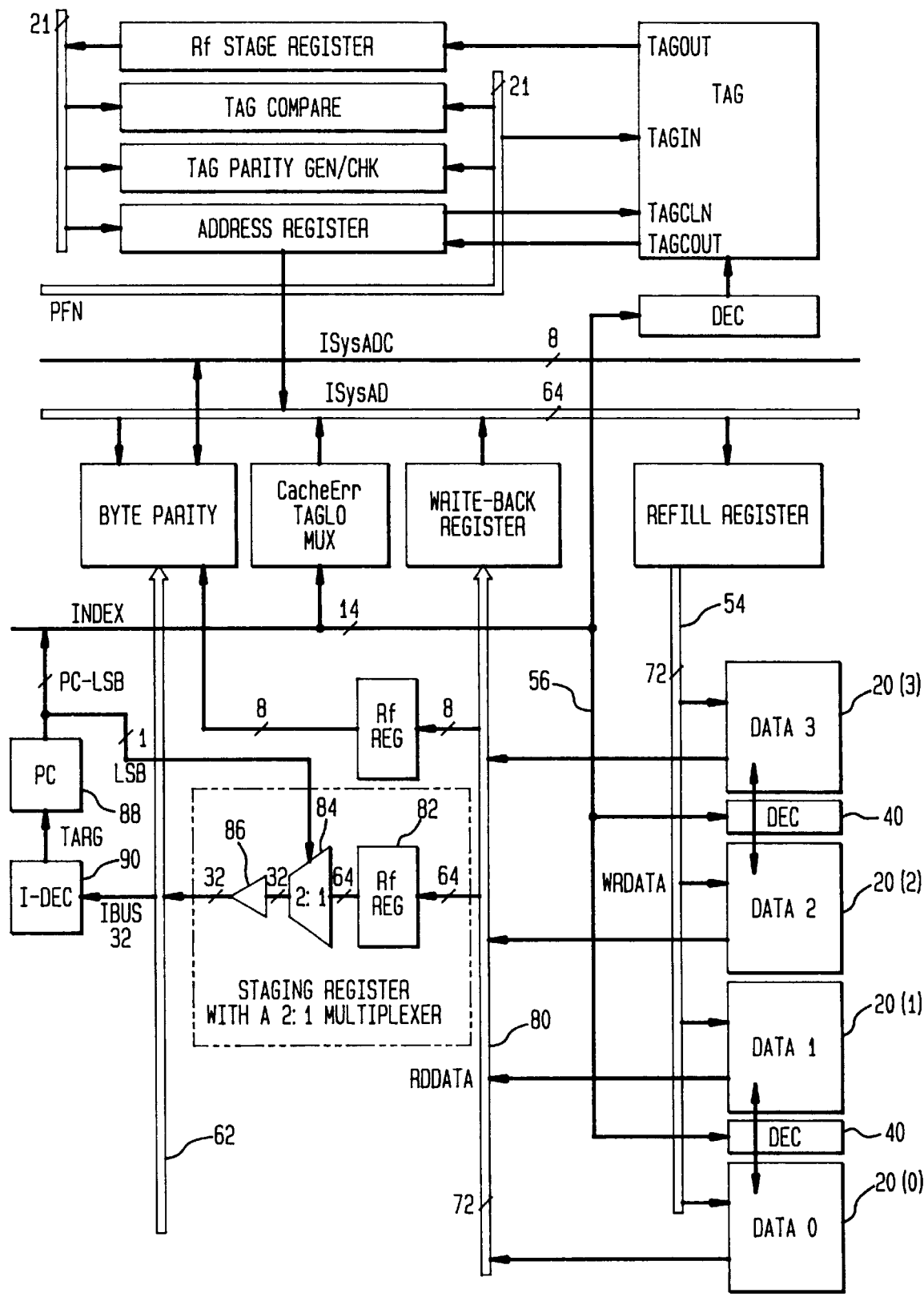
FIG. 5 is a block schematic diagram of the system for reducing I-Cache accesses.

The system for reducing cache accesses is depicted in FIG. 5. As previously described, a block of 64 bits of data is read from the I-Cache 20 during every access cycle. A feature of RISC processors is that all instructions have the same length, in this embodiment 32 bits. Accordingly, each block accessed includes a pair of sequentially addressed instructions.

In FIG. 5, the output of each cache segment 20 is coupled to a RdData BUS 80. A 64-bit staging register 82 has its input coupled to the RdData BUS 80 and an output coupled to an instruction selection MUX 84. The output of the MUX 84 is coupled to the IBUS 62 via a driver 86. A program counter 88 has outputs coupled to the INDXBUS 56 and the MUX 84. An instruction decoder 90 is coupled to the IBUS 62 and generates TARG address information for the program counter and program flow change information for the controller when a program flow changing instruction, e.g., a branch or jump, is received at the instruction decoder. The TARG information is provided to the program counter 88.

The operation of the system depicted in FIG. 5 will now be described. During sequential program execution, the program counter increments the index every cycle and the controller 12 forces a cache access every other cycle. The controller 12 utilizes a part of the index to transfer a 64-bit block from the I-Cache 20 to the staging register 82 every even cycle. The LSB of the index is utilized to control the MUX 84 to transfer either the even (first) instruction in the staging register to the instruction decoder during the cycle when the even address is generated or the odd (second) instruction in the staging register to the decoder 90 during the next cycle.

If the decoded instruction changes the program flow from sequential execution, then target address information is transferred from the decoder 90 to the program counter 88 to generate a target address. The controller 12, in response to the program flow information, forces a cache access and immediately transfers the word including the instruction selected by the target address to the staging register 82. The LSB of the target address controls the MUX 84 to select the target instruction to be transferred to the IBUS 62. The system then returns to sequential execution.

Thus, except for program flow changes, the number of cache fetches is reduced by factor of two in comparison to standard systems.

The invention has now been described with reference to the preferred embodiment. Alternatives and modifications will now be apparent to persons of ordinary skill in the art. For example, although transferring pairs of instructions to the staging registers has been described, larger groups could be fetched to further reduce I-Cache accesses. Accordingly, it is not intended to limit the invention except as provided by the appended claims.

What is claimed is:

1. An instruction fetch system for use in a RISC processor that executes fixed length instructions every cycle and has an on-chip instruction cache, the instruction fetch system being configured to reduce power consumption of the on-chip instruction cache, the instruction fetch system comprising:

means for accessing a first group of instructions having a first set of ordered addresses and a second group of instructions having a second set of ordered addresses, simultaneously, from an instruction cache, wherein said first group of instructions is to be executed during a first cycle and said second group of instructions is to be executed during a second cycle, wherein said second set of ordered addresses is addressed in sequence from said first set of ordered addresses;

means for transferring said first group of instructions to an instruction decoder for execution during said first cycle; and means for transferring said second group of instructions to said instruction decoder for execution during said second cycle, whereby power consumed by memory modules and support circuitry of said instruction cache is reduced by requiring instruction cache accesses only every other cycle.

2. The instruction fetch system of claim 1, further comprising:

a program counter for generating said sequence of ordered instruction addresses during successive cycles.

3. The instruction fetch system of claim 2, wherein said instruction decoder comprises:

means for generating target address information when a program flow changing instruction is decoded.

4. The instruction fetch system of claim 3, wherein said program counter further comprises:

means for generating a target address during a cycle when said target address information is generated.

5. The instruction fetch system of claim 4, further comprising:

means for accessing said instruction group when a generated target address is either said first address or one of said following addresses; and means for transferring the instruction addressed by said generated target address to said instruction decoder during the cycle when said target address is generated.

6. The instruction fetch system of claim 1, further comprising:

a staging register for storing said first instruction and said following instructions during said first cycle.

7. The instruction fetch system of claim 1, wherein said means for transferring comprises:

means for selecting one of said instructions from said instruction group based on one of said instruction addresses when said one of said instruction addresses is generated.

8. In a RISC processor that executes fixed length instructions every cycle and has an on-chip instruction cache, a method for fetching instructions so as to reduce power consumption of the on-chip instruction cache, the method comprising the steps of:

accessing a first group of instructions having a first set of ordered addresses and a second group of instructions having a second set of ordered addresses, simultaneously, from an instruction cache, wherein said first group of instructions is to be executed during a first cycle and said second group of instructions is to be executed during a second cycle, wherein said second set of ordered addresses is addressed in sequence from said first set of ordered addresses;

transferring said first group of instructions to an instruction decoder for execution during said first cycle; and transferring said second group of instructions to said instruction decoder for execution during said second cycle when a corresponding one of said predetermined number of following addresses is generated, whereby power consumed by memory modules and support circuitry of said instruction cache is reduced by requiring instruction cache accesses only every other cycle.

9. The method of claim 8, further comprising the step of:

generating said sequence of ordered instruction addresses during successive cycles.

10. The method of claim 9, further comprising the step of:

generating target address information when a program flow changing instruction is decoded.

11. The method of claim 10, further comprising the step of:

generating a target address during a cycle when said target address information is generated.

12. The method of claim 11, further comprising the steps of accessing said instruction group when a generated target address is either said first address or one of said following addresses; and transferring the instruction addressed by said generated target address to said instruction decoder during the cycle when said target address is generated.

13. The method of claim 8, further comprising the step of:

storing said first instruction and said following instructions during said first cycle.

14. The method of claim 8, further comprising the step of:

selecting one of said instructions from said instruction group based on a corresponding one of said instruction addresses when said one of said instruction addresses is generated.

* * * * *